(12) United States Patent
Yoshino et al.

(10) Patent No.: US 9,277,664 B2
(45) Date of Patent: Mar. 1, 2016

(54) CONNECTOR

(71) Applicants: Satoshi Yoshino, Tokyo (JP); Shiro Kishimoto, Tokyo (JP); Hiroshi Akino, Tokyo (JP)

(72) Inventors: Satoshi Yoshino, Tokyo (JP); Shiro Kishimoto, Tokyo (JP); Hiroshi Akino, Tokyo (JP)

(73) Assignee: Kabushiki Kaisha Audio-Technica, Tokyo (JP)

( * ) Notice: Subject to any disclaimer, the term of this patent is extended or adjusted under 35 U.S.C. 154(b) by 0 days.

(21) Appl. No.: 14/628,757

(22) Filed: Feb. 23, 2015

(65) Prior Publication Data
US 2015/0270638 A1 Sep. 24, 2015

(30) Foreign Application Priority Data
Mar. 19, 2014 (JP) ................... 2014-056630

(51) Int. Cl.
*H01R 13/52* (2006.01)
*H05K 5/06* (2006.01)
*H04R 1/00* (2006.01)

(52) U.S. Cl.
CPC . *H05K 5/064* (2013.01); *H04R 1/00* (2013.01)

(58) Field of Classification Search
CPC ........................ H01R 13/5221; H01R 13/5208
USPC .................. 439/274, 275, 587, 588, 589, 148
See application file for complete search history.

(56) References Cited

U.S. PATENT DOCUMENTS

| 8,747,157 | B2 * | 6/2014 | Tashiro | .............. | H01R 13/4364 |
| | | | | | 439/246 |
| 9,029,699 | B2 * | 5/2015 | Kato | .................. | H01R 13/5208 |
| | | | | | 174/72 A |
| 9,166,328 | B2 * | 10/2015 | Eckel | .................... | H01R 13/506 |
| 2013/0031985 | A1 * | 2/2013 | Wade | .................. | G01L 19/0007 |
| | | | | | 73/753 |
| 2014/0158422 | A1 * | 6/2014 | Fan | ......................... | H02G 3/22 |
| | | | | | 174/650 |

FOREIGN PATENT DOCUMENTS

JP 2006067455 A 3/2006

* cited by examiner

*Primary Examiner* — Phuongchi T Nguyen
(74) *Attorney, Agent, or Firm* — Whitham, Curtis, Christofferson & Cook, P.C.

(57) ABSTRACT

A connector according to the invention includes: a metal cylinder; a conductive receptacle having an end fitted in an end of the metal cylinder; a pin assembly fitted in the conductive receptacle; pins fixed to the pin assembly, the pins being connected to a cable; a circuit board fixed to the other end of the metal cylinder, the circuit board having through holes electrically connected to the pins; and a sealant disposed between the circuit board and the pin assembly, the sealant infilling gaps between the pins and the through holes of the circuit board.

6 Claims, 15 Drawing Sheets

Related Art

Related Art

CONNECTOR

TECHNICAL FIELD

The present invention relates to a connector for connection between audio devices.

BACKGROUND ART

Cables including standardized connectors are used to connect audio devices. For example, a cable is equipped with a male connector at one end, whereas an audio device is equipped with a female connector.

One of the audio devices is a microphone. Microphones are composed of various microphone units. For example, a microphone unit of a condenser microphone has a high output impedance and thus requires an impedance converter. The impedance converter includes a field effect transistor (FET). In a tiepin or gooseneck condenser microphone, components, such as a microphone unit, of the microphone should be miniaturized and compactly disposed in a small case. The impedance converter is disposed inside the microphone unit for the same purpose.

The microphone further includes a circuit housing. The circuit housing is provided separately from the microphone unit and accommodates a low-cut circuit and an output circuit. The low-cut circuit and the output circuit accommodated in the circuit housing are collectively called a power module. The microphone is connected to an external device (e.g., a mixer or an amplifier) through a dedicated cable.

The microphone unit converts sound into electrical signals and transmits the electrical signals to the power module. The power module receives the electrical signals from the microphone unit and outputs the received electrical signals through the output circuit in the circuit housing.

The microphone is connected to the external device through a two-conductor shielded cable. The cable includes two conductors functioning as signal lines and shielding wires covering the conductors. It is noted that one of the signal lines in the cable may serve as a power line. In this case, the condenser microphone is energized though the conductor functioning as the power line. The signal line outputs the audio signals transmitted from the impedance converter via the power module to the external device. The shielding wires electrostatically shield and ground the power line and the signal line.

The cable including the signal line and the power line transmits unbalanced audio signals. The unbalanced signals are readily affected by external electromagnetic waves and thus are susceptible to external noise. For example, the external electromagnetic waves reach the cable and then enter the microphone unit or the power module through the cable. The external electromagnetic waves are detected by a semiconductor element included in the microphone unit or the power module. The audio signals are contaminated with electromagnetic waves in the form of noise. High-intensity electromagnetic waves can cause noise even in balanced signals. In other words, external electromagnetic waves can cause noise in signals output from the microphone regardless of the scheme of transmitting audio signals. In order to prevent the noise, the connectors that connect the microphone and the cable must be electromagnetically shielded.

For example, a connector mounted on the microphone (hereinafter referred to as "microphone connector") enables a cable for the microphone (hereinafter referred to as "microphone cable") to be plugged or unplugged into or from the microphone or the mixer. The microphone cable is equipped with a cable connector at an end. The cable connector is coupled to the microphone connector to electrically connect the cable to the microphone.

The cable connector includes, for example, three thin-tubular pin receivers (sockets). In this case, the three pin receivers of the cable connector can receive three pins included in the microphone connector.

The microphone connector includes a cylindrical metal receptacle and is mounted on the microphone or the mixer. The microphone connector has an electromagnetic-wave blocking structure. In the electromagnetic-wave blocking structure, a first pin for ground is electrically connected to the outer case of the microphone or the mixer and thus is grounded.

In a traditional electromagnetic-wave blocking structure, the connecting terminal of the first pin is wired to a grounded portion of the microphone or the mixer. Unfortunately, this structure introduces high-frequency current into the microphone or the mixer and thus leads to noise in output signals. In order to prevent the noise contamination, some connectors include receptacles each including a ceramic capacitor (chip component) soldered across the first pin and a second pin and a ceramic capacitor soldered across the first pin and a third pin. The ceramic capacitors across the respective pins cause short circuit of high-frequency current, thereby preventing the noise.

Unfortunately, ceramic capacitors directly soldered across the respective pins may be broken after repeated use. In specific, the pins of the microphone connector are slightly displaced by every plugging or unplugging of the microphone cable into or from the microphone connector. The slightly displaced pins apply stress to the ceramic capacitors via the solder and may break the ceramic capacitors.

In order to solve this problem, the present inventors have invented improved arrangement of ceramic capacitors for blocking external electromagnetic waves in a connector of an audio device, in particular, a microphone connector, as is disclosed in Japanese Unexamined Patent Application Publication No. 2006-067455 (hereinafter referred to as "PTL 1").

According to PTL 1, pins of the microphone connector are connected to a circuit board such as a printed circuit board. The circuit board has specific wiring patterns and is mounted with capacitors connected to the wiring patterns. In specific, the capacitors on the circuit board are each connected across the wiring pattern coupled to a ground pin and a wiring pattern coupled to other pin. These capacitors cause short circuit of high-frequency current, thereby blocking external electromagnetic waves.

In the connector disclosed in PTL 1, the stress by the plugging or unplugging of a cable is not applied to the capacitors for blocking electromagnetic waves. This configuration can protect the capacitors, for example, ceramic capacitors, against damaging by physical force.

SUMMARY OF INVENTION

Technical Problem

Unfortunately, the connector disclosed in PTL 1 still has a problem. In specific, the solder may short a circuit during the fabrication of the connector disclosed in PTL 1. The circuit is shorted because the molten solder used for connection of the pins to the circuit board leaks into the connector through gaps between the pins and the circuit board.

FIGS. 12 and 13 are each a longitudinal sectional view of a connector 10 in the related art. With reference to FIGS. 12 and 13, the connector 10 includes a cylindrical metal receptacle 30. The receptacle 30 has a flange at one end (the lower end in FIG. 12 or 13). The receptacle 30 is provided with a pin assembly 40 fitted in an opening at the other end of the receptacle 30. The pin assembly 40 includes an insulating base 43 and pins 41 extending through the insulating base 43 across the thickness. One end of each pin 41 functions as a connecting terminal 42, which is wired to a power module of the microphone, for example.

The upper end of the receptacle 30 is fitted in a metal cylinder 20. The metal cylinder 20 is provided with a circuit board 80 at the open end. The circuit board 80 has through holes for receiving the pins 41. The circuit board 80 further has wiring patterns on both the front and rear faces. The wiring patterns are printed around the through holes for receiving the pins 41, so that the pins 41 can be soldered to the wiring patterns.

FIG. 12 is a longitudinal sectional view of the connector 10 including the pins 41 appropriately soldered to the circuit board 80. With reference to FIG. 12, an appropriate volume of molten solder 70 can spread in the entire through holes of the circuit board 80 and forms fine fillets on both faces of the circuit board 80. This structure establishes the tight connection of the pins 41 to both faces of the circuit board 80. Such a structure of the connector 10 including the solder fillets illustrated in FIG. 12 can avoid the short circuit between each pin 41 and each wiring pattern on the circuit board 80 and between each pin 41 and other metal portion (e.g., the metal cylinder 20).

FIG. 13 illustrates an example of the pins 41 inappropriately soldered to the circuit board 80. With reference to FIG. 13, an excess volume of molten solder 70 leaks through the through holes of the circuit board 80 to the rear face of the circuit board 80. Such excess solder 70 forms lumps on the rear face of the circuit board 80, as illustrated in FIG. 13. The lumps of the solder 70 lead to unintentional electrical conduction between a pin 41 and a wiring pattern on the circuit board 80 that were originally insulated from each other. The lumps of the solder 70 also short the circuits between the pins 41, the circuit board 80, and the metal cylinder 20.

An object of the present invention, which has been accomplished to solve the above problems, is to provide a connector for connecting audio devices that can be safely and efficiently fabricated without short circuit between pins, capacitors, and metal portions in the process of soldering the pins to a circuit board.

Solution to Problem

A connector according to the invention includes: a metal cylinder; a conductive receptacle having an end fitted in an end of the metal cylinder; a pin assembly fitted in the conductive receptacle; pins fixed to the pin assembly, the pins being connected to a cable; a circuit board fixed to the other end of the metal cylinder, the circuit board comprising through holes electrically connected to the pins; and a sealant disposed between the circuit board and the pin assembly, the sealant infilling gaps between the pins and the through holes of the circuit board.

Advantageous Effects of Invention

The invention can avoid short circuit between pins, capacitors, and metal portions of a connector in the process of soldering the pins to the circuit board. The invention thus enables safe and efficient fabrication of connectors.

DESCRIPTION OF EMBODIMENTS

A connector according to an embodiment of the invention will now be described with reference to the accompanying drawings. The connector according to the invention is used for connection between different audio devices. In general, audio devices are connected through cables. The connector according to the invention can be applied to either of an end of the connecting cable and an audio device for receiving the other end of the cable. The following description focuses on a microphone as an example audio device. The connector according to the invention is applied to the audio device (microphone) in the following description by way of example. The cable is of a two-conductor shielded type including two conductors functioning as a signal line and a power line, respectively, in the following description. The configuration and effects of the connector according to the invention are advantageous for any signal type.

Figure 10:
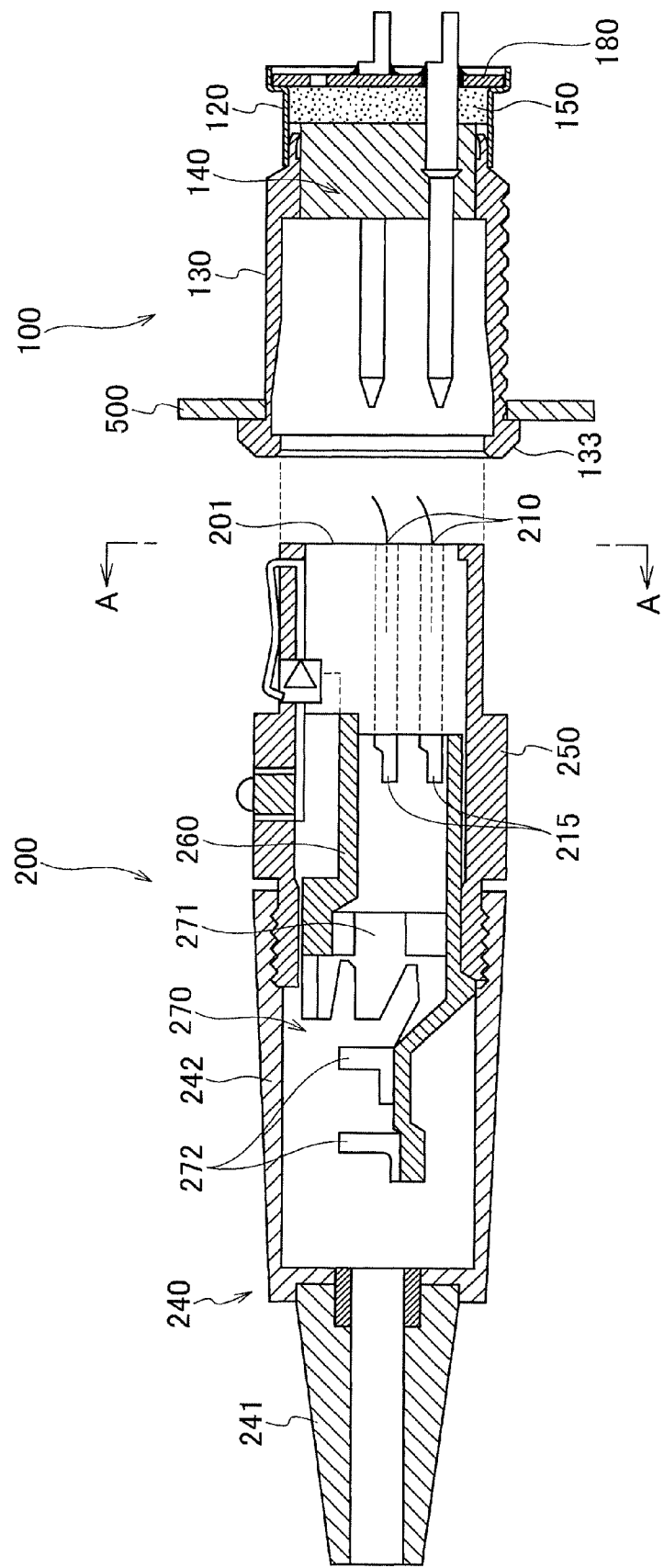
FIG. 10 is a longitudinal sectional view of the entire structures of a microphone connector according to the invention and a cable connector to be connected to the microphone connector.

The entire structures of a microphone connector and a cable connector will now be described. FIG. 10 is a longitudinal sectional view of the entire structures of a connector 100 according to the embodiment and a cable connector 200 to be connected to the connector 100. The cable connector 200 will now be described in detail.

The cable connector 200 is attached to an end of a cable (not shown). The cable connector 200 includes a connecting port 201 including embedded pin receivers 210. The pin receivers 210 receive three pins included in the connector 100. The connecting port 201 is provided with terminals 215 protruding from the rear end face (the lower face in FIG. 10) of the connecting port 201. The terminals 215 are electrically integrated with the pin receivers 210. The terminals 215 are each soldered to the two conductors and the shielding wires at one end of the cable.

The cable is surrounded by an insulating receptacle 260. The insulating receptacle 260 covers and protects the joint between the terminals 215 and the cable. The insulating receptacle 260 prevents the short circuit between the joint and the interior of a housing 250. The insulating receptacle 260 has an outer diameter substantially equal to the outer diameter of the connecting port 201.

The insulating receptacle 260 is fitted around a cylindrical segment 271 of a fitting 270 at the rear end of the insulating receptacle 260. The fitting 270 includes claws 272, which substantially occupy the rear half of the fitting 270. The claws 272 crimp the outer insulating sheath of the cable. This configuration can integrate the insulating receptacle 260, the fitting 270, and the cable together.

The connecting port 201 is fitted in a cylindrical housing 250. The housing 250 has a sufficient length to cover the connecting port 201, the insulating receptacle 260, and the cylindrical segment 271. The rear end of the housing 250 is fitted in the front end of a bushing 240.

The bushing 240 includes a tapered basal segment 241 and a cover segment 242 having a larger diameter than that of the basal segment 241. The basal segment 241 has an inner diameter slightly larger than the outer diameter of the cable. The cover segment 242 covers the fitting 270. The basal segment 241 has a central opening to receive the cable (not shown).

Figure 11:
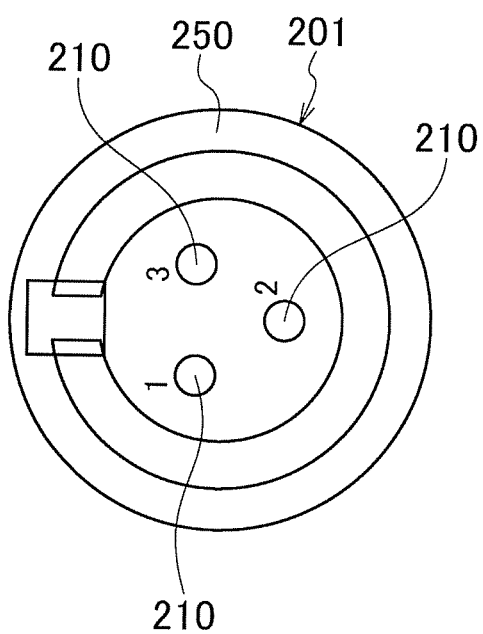
FIG. 11 is a cross-sectional view of the cable connector illustrated in FIG. 10 along a line A-A.
Figure 12:
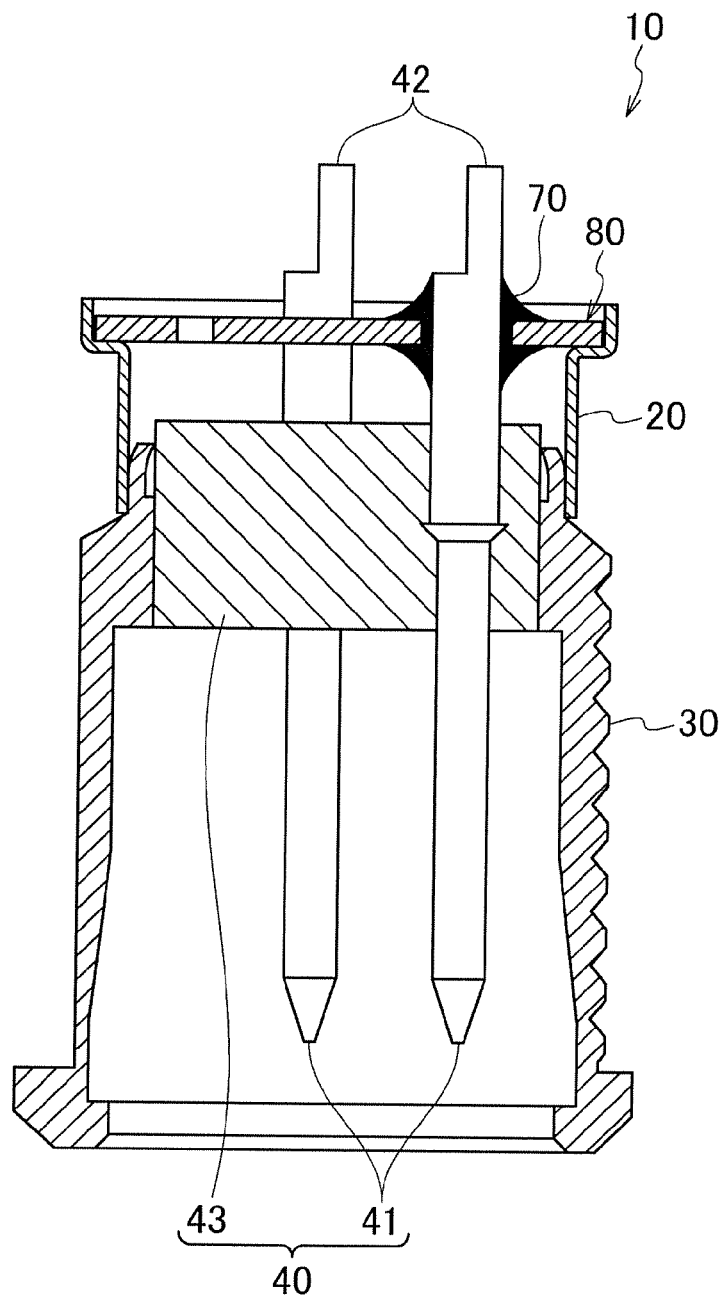
FIG. 12 is a longitudinal sectional view of a connector in the related art fabricated through appropriate soldering.
Figure 13:
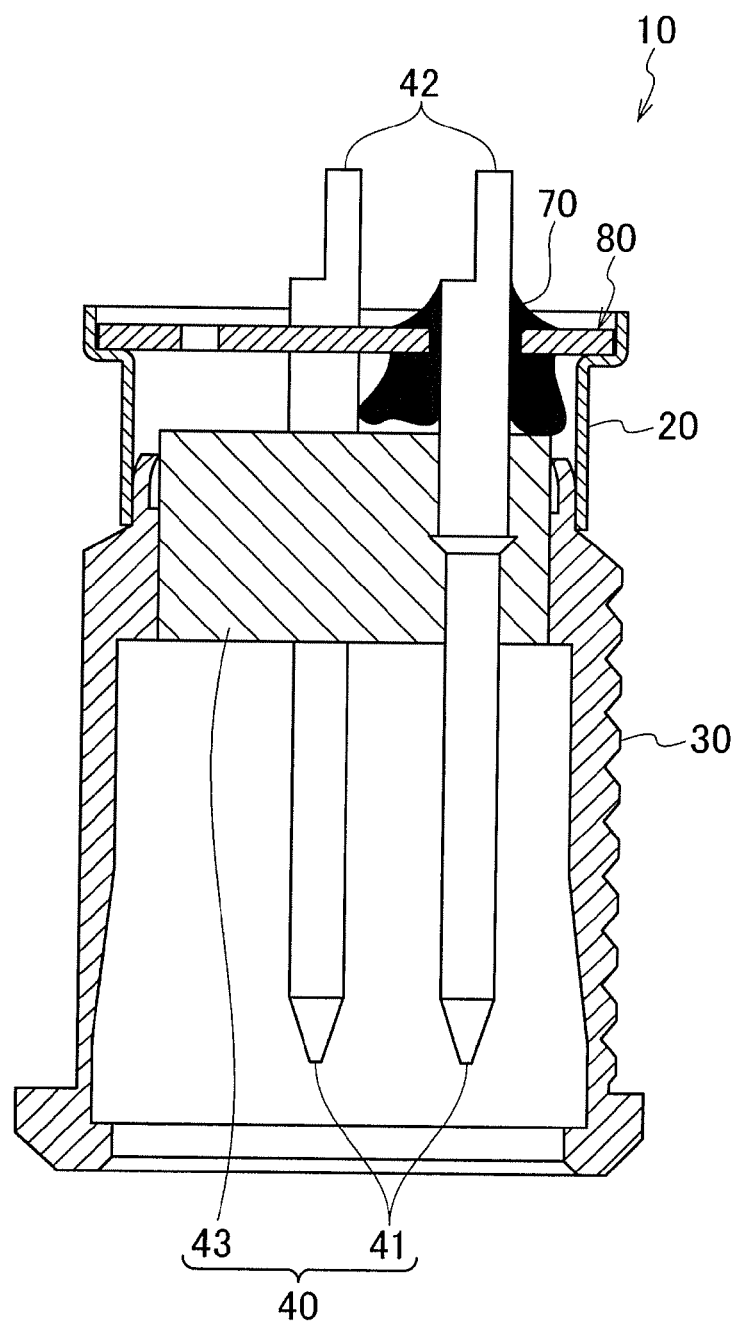
FIG. 13 is a longitudinal sectional view of a connector in the related art fabricated through inappropriate soldering.

FIG. 11 is a cross-sectional view of the cable connector 200 illustrated in FIG. 10 along a line A-A. With reference to FIG. 11, the cable connector 200 is of a three-pin type. A first pin receiver of the connecting port 201 for shielding is connected to the shielding wires of the cable. The first pin receiver of the connecting port 201 is electrically connected to the housing 250 and thus is grounded. The second pin receiver is connected to the signal line of the cable. The third pin receiver is connected to the power line of the cable.

Referring back to FIG. 10, the connector 100 will now be described in detail. The connector 100 includes a metal cylinder 120, a receptacle 130, a pin assembly 140, a sealing resin (sealant) 150, and a circuit board 180, such as a printed circuit board. The receptacle 130 has a flange 133 around the outer periphery of one end.

Figure 1:
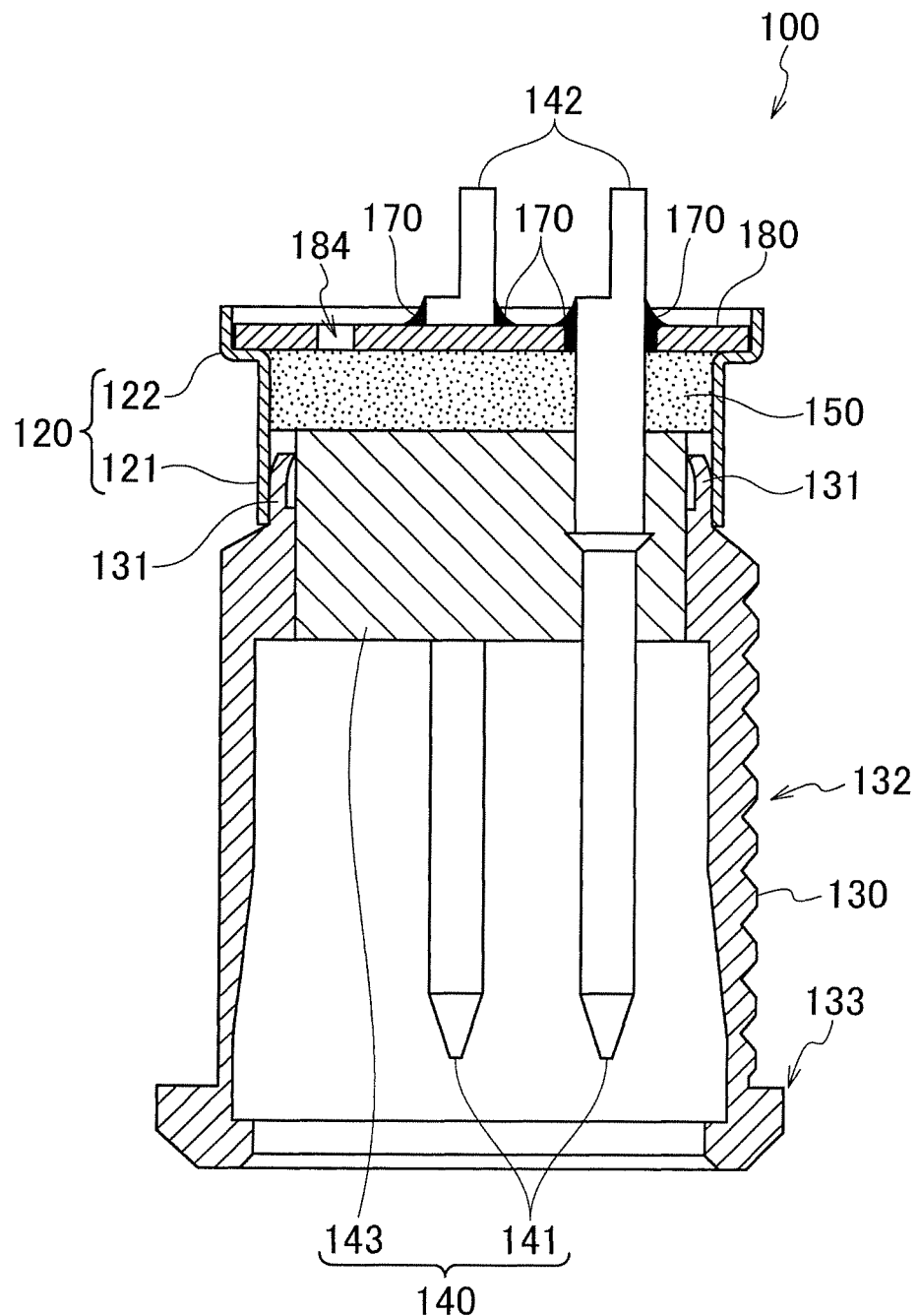
FIG. 1 is a longitudinal sectional view of a connector according to an embodiment of the invention.

The following description focuses on the detailed configuration of the connector 100. FIG. 1 is a longitudinal sectional view of the connector 100 according to the embodiment. With reference to FIG. 1, the receptacle 130 is substantially cylindrical and is composed of a conductive material. The receptacle 130 has an external thread 132 around the outer periphery. The external thread 132 is partially flattened along a longitudinal plane (D-cut face) and thus has a D-shaped cross section. FIG. 1 illustrates the longitudinal cross section along the D-cut face. The receptacle 130 has a flange 133 around the outer periphery of one end (the lower end in FIG. 1).

The connector 100 is fixed to, for example, a case 500 of the microphone, as illustrated in FIG. 10. The receptacle 130 is inserted from the outside into the case 500 through an opening provided to the case 500. A nut is then screwed to the external thread 132 from the inside of the case 500. The external wall of the case 500 is held between the nut and the flange 133 to fix the connector 100 to the case 500.

The receptacle 130 further has a tapered segment on the outer periphery in the vicinity of the upper end. The tapered segment has a smaller outer diameter than that of the external thread 132 and is continuous to the external thread 132. The tapered segment is provided with a circumferential ridge 131 protruding from the top of the tapered segment.

The pin assembly 140 is fixed inside the ridge 131 at the top opening of the receptacle 130. The pin assembly 140 may be fixed in the opening of the receptacle 130 through any appropriate means, such as fitting or screwing. For example, the pin assembly 140 is inserted into the opening of the receptacle 130, and then the ridge 131 is bent inward to crimp the pin assembly 140. The pin assembly 140 is thus fixed to the receptacle 130.

The pin assembly 140 includes contact pins 141 and an insulating base 143. The contact pins 141 are fixed to the insulating base 143. The contact pins 141 consist of three pins, for example, and extend through the insulating base 143 across the thickness. The contact pins 141 each include a connecting terminal 142 at one end. The connecting terminals 142 extend outward from the insulating base 143.

The receptacle 130 receives the connecting port 201 of the cable connector 200 (refer to FIG. 10) on the inner periphery. The receptacle 130 receives the connecting port 201 such that the three contact pins 141 of the receptacle 130 fit in the respective pin receivers 210 embedded in the connecting port 201. The contact pins 141 correspond to the respective pin receivers 210. In other words, the three contact pins 141 are respectively dedicated to ground, signals, and power supply. The connecting terminals 142 included in the contact pins 141 are wired to components such as the power module. Accordingly, the electrical signals from the components such as the power module are output through the connecting terminals 142, the contact pins 141, the pin receivers 210, and the microphone cable.

The ridge 131 of the receptacle 130 is fitted into the metal cylinder 120. The metal cylinder 120 is electrically integrated with the receptacle 130. The metal cylinder 120 includes a cylindrical base 121 and a flange-shaped circuit-board receiver 122 having a larger diameter than that of the cylindrical base 121.

The circuit-board receiver 122, which is an open end of the metal cylinder 120, is fitted around the circuit board 180. The three connecting terminals 142 extend through respective through holes provided in the circuit board 180.

Figure 2:
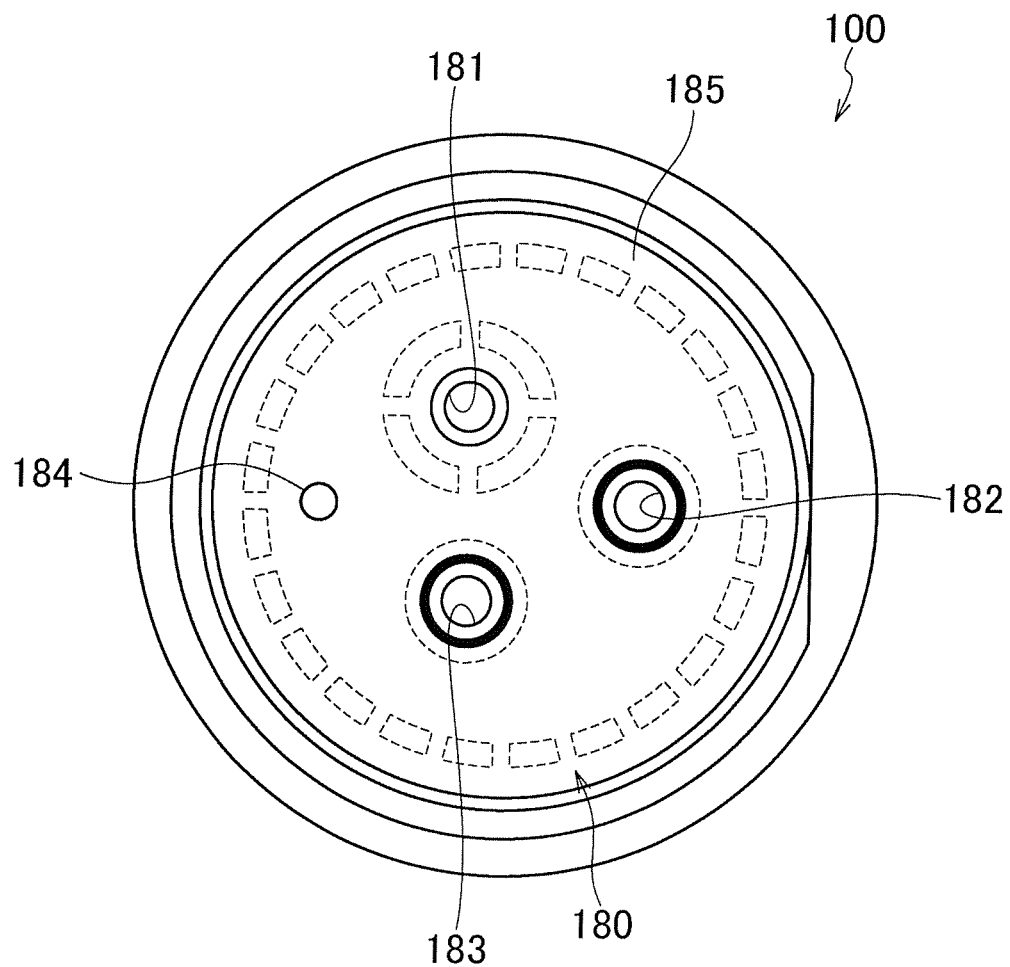
FIG. 2 is a top view of the connector illustrated in FIG. 1.

The circuit board 180 will now be described. FIG. 2 is a top view of an example connector 100. With reference to FIG. 2, the circuit board 180 has a substantially circular contour. The circuit board 180 has wiring patterns 185 printed on both front and rear faces. The circuit board 180 further has three through holes (a first hole 181, a second hole 182, and a third hole 183). The three through holes receive the respective connecting terminals 142 included in the three contact pins 141. The connecting terminal 142 of a first pin for ground extends through the first hole 181, the connecting terminal 142 of a second pin for signals extends through the second hole 182, and the connecting terminal 142 of a third pin for power supply extends through the third hole 183.

Figure 3A:
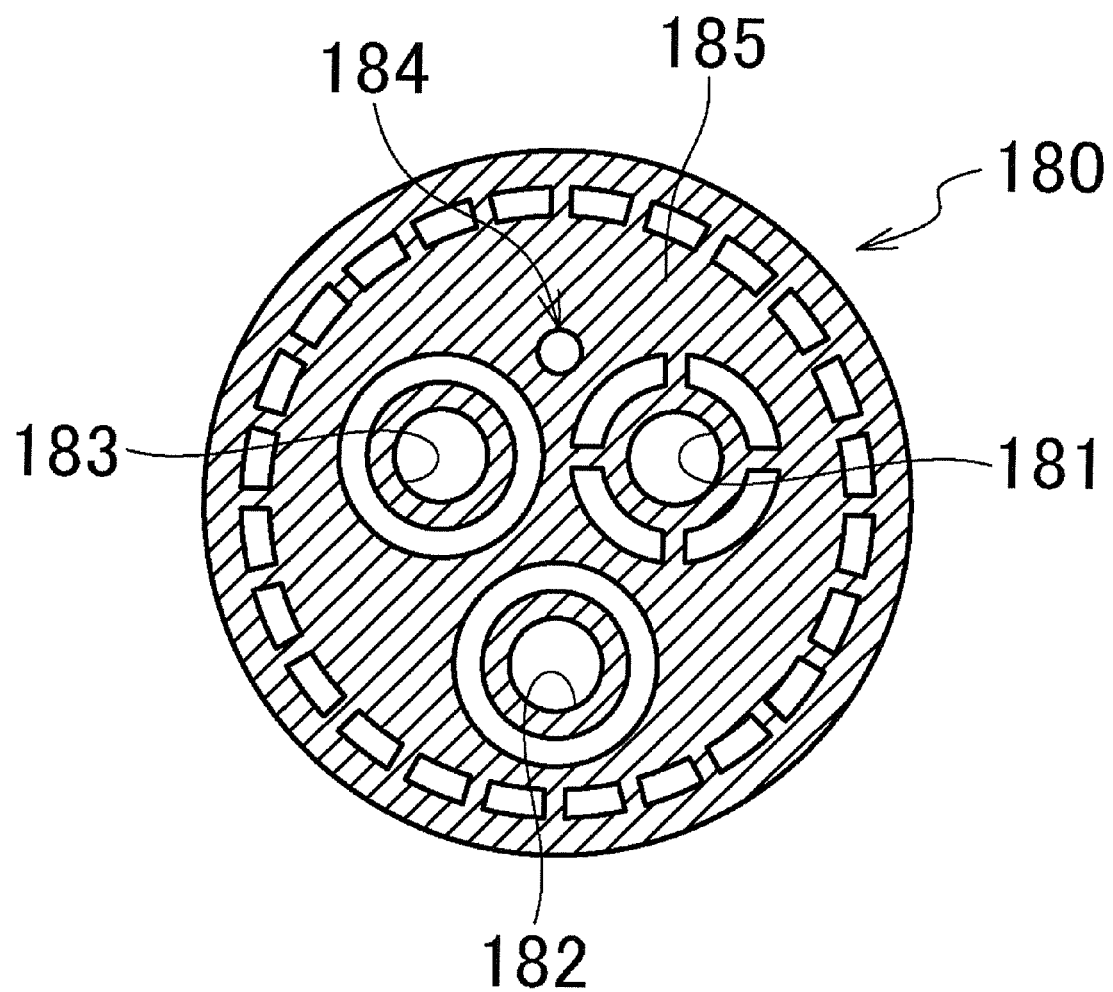
FIG. 3A is a plan view of example wiring patterns printed on the front face of a circuit board included in the connector illustrated in FIG. 1.
Figure 3B:
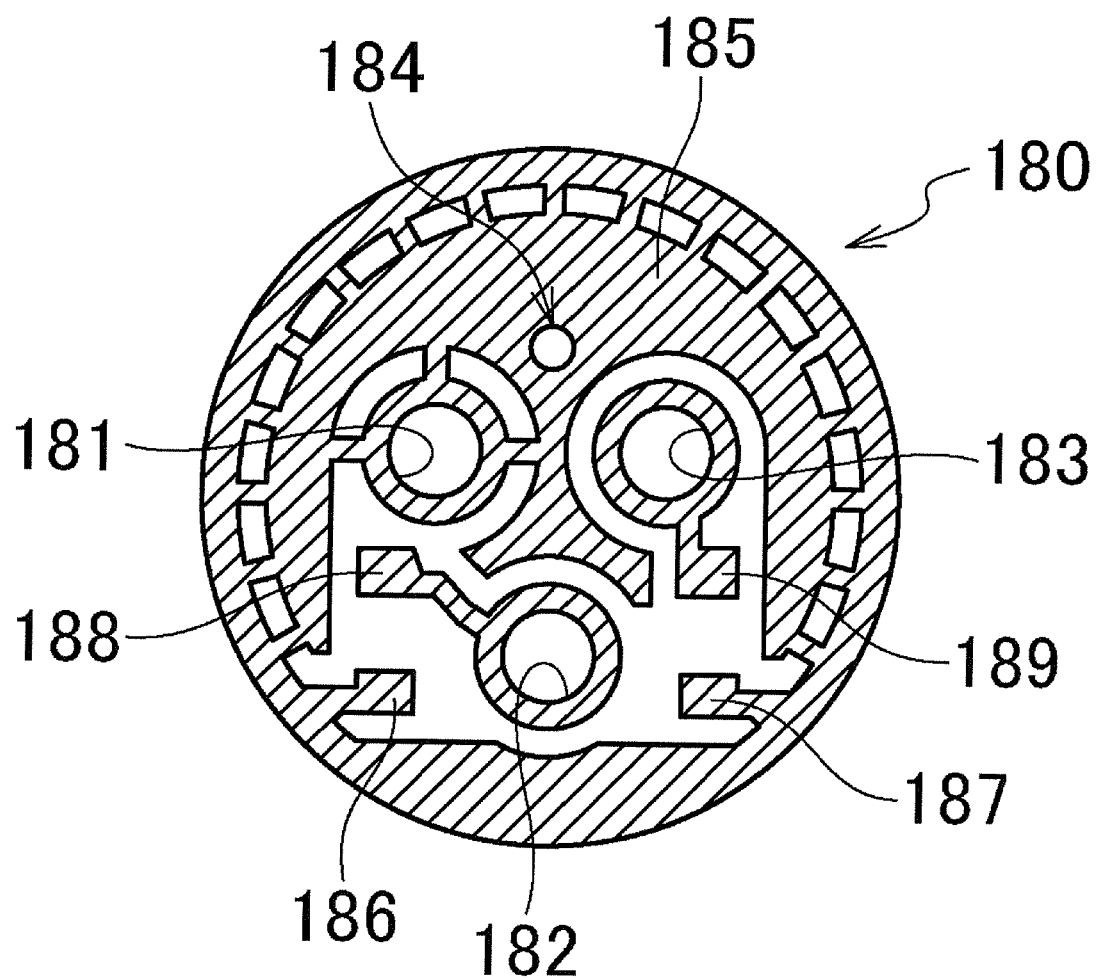
FIG. 3B is a plan view of example wiring patterns printed on the rear face of a circuit board included in the connector illustrated in FIG. 1.
Figure 3C:
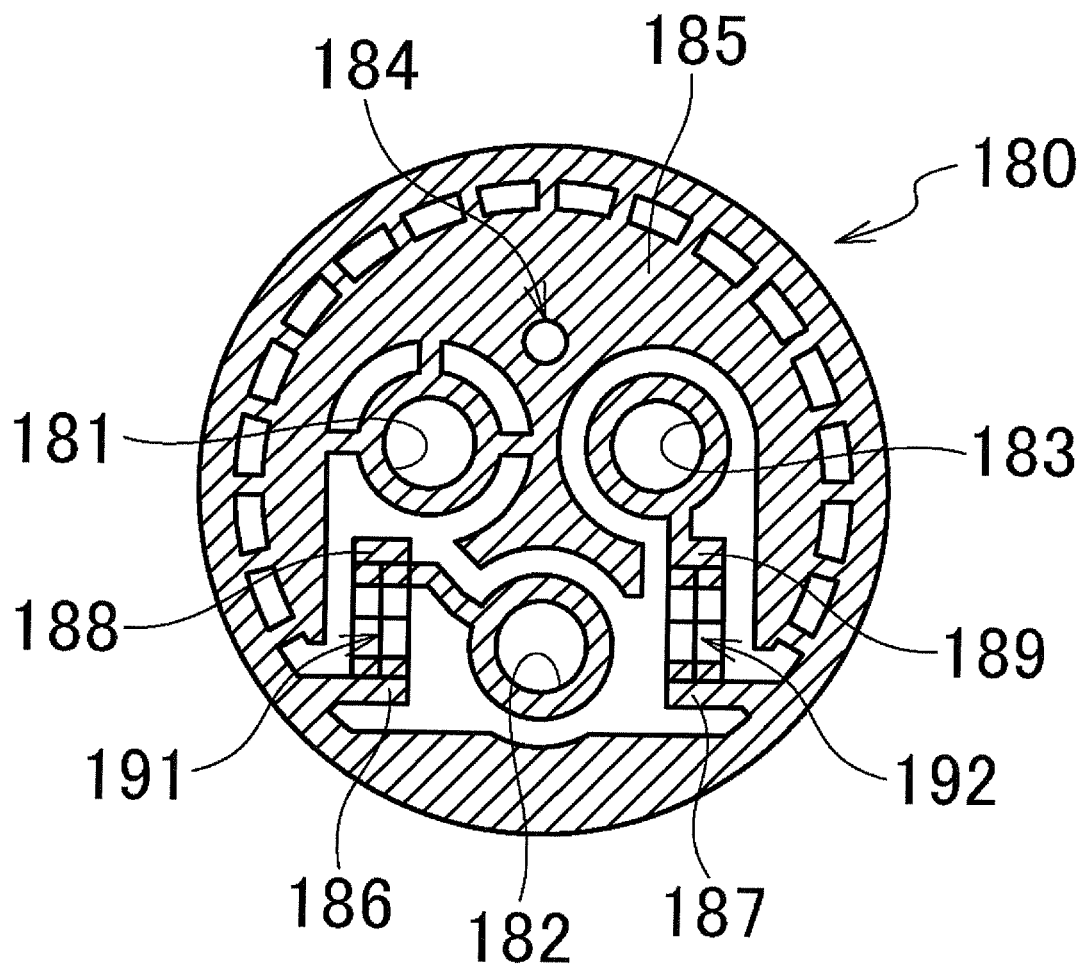
FIG. 3C illustrates capacitors mounted on the rear face of a circuit board included in the connector illustrated in FIG. 1.

FIG. 3A is a plan view of the wiring patterns 185 printed on the front face of the circuit board 180 included in the connector 100. FIG. 3B is a plan view of the wiring patterns 185 printed on the rear face of the circuit board 180. FIG. 3C is a plan view of capacitors mounted on the circuit board 180.

The front and rear faces of the circuit board 180 have different wiring patterns 185. The circuit board 180 further has an opening 184 in addition to the three through holes. The opening 184 extends through the circuit board 180 across the thickness.

The description then focuses on the wiring patterns 185 on the rear face of the circuit board 180. With reference to FIG. 3B, the wiring patterns 185 on the rear face are provided with circular solder lands to be soldered to the respective connecting terminals 142, and solder lands 186, 187, 188, and 189 continuous to the respective wiring patterns.

A wiring pattern to be connected to the connecting terminal 142 for ground covers most of the circuit board 180 and surrounds the other wiring patterns to be connected to the other connecting terminals 142.

The solder lands 186 and 187 are provided on the wiring pattern for ground. The solder land 186 is adjacent to the solder land 188 provided on the wiring pattern to be connected to the second pin. The solder land 187 is adjacent to the solder land 189 provided on the wiring pattern to be connected to the third pin.

With reference to FIG. 3C, a ceramic capacitor 191 is soldered on the rear face of the circuit board 180. The ceramic capacitor 191 is mounted across the solder lands 186 and 188. A ceramic capacitor 192 is also mounted across the solder lands 187 and 189, like the ceramic capacitor 191.

The circular solder lands surround the respective through holes. The connecting terminals 142 are soldered to the respective circular solder lands on both faces of the circuit board 180. The wiring pattern for ground on the circuit board 180 is electrically connected to the metal cylinder 120 via the solder. The receptacle 130 is thus electrically connected to the ground line of the microphone cable via the metal cylinder 120. This configuration grounds the receptacle 130.

Referring back to FIG. 1, a space behind the rear face of the circuit board 180 is filled with an insulating sealing resin 150. The space behind the circuit board 180 (the space defined by the circuit board 180, the inner periphery of the metal cylinder 120, and the top face of the insulating base 143) is completely filled with the sealing resin 150.

During the soldering of the connecting terminals 142 to the wiring patterns 185 on the circuit board 180, molten solder 170 would readily flow through the through holes of the circuit board 180 to the rear face of the circuit board 180, if no measure would be taken on the rear face. Since the space behind the circuit board 180, however, is filled with the sealing resin 150, the molten solder 170 is blocked at the ends of the through holes on the rear face of the circuit board 180, to form fine solder fillets as illustrated in FIG. 1. This configuration can prevent the molten solder 170 from conducting electricity or causing short circuit between originally insulated portions.

The connector 100 according to the embodiment facilitates the soldering of the contact pins 141 to the circuit board 180, which process is necessary in the fabrication. The connector 100 can thus be more effectively fabricated at high yield.

The filling with the sealing resin 150 can improve the adhesion between the circuit board 180, the contact pins 141, and the receptacle 130. This configuration can reduce the stress on the connector 100 during the plugging or unplugging of the connector 100.

In the connector 100, the sealing resin 150 may contain an insulating magnetic powder. The sealing resin 150 containing the magnetic powder can enhance the shield of electromagnetic waves of the connector 100.

The circuit board 180 has the opening 184. If the sealing resin 150 thermally expands during the soldering of the contact pins 141 to the circuit board 180, the opening 184 allows the pressure of the sealing resin 150 to escape. The opening 184 thus can prevent the fixation of the circuit board 180 from being unstabilized by the expansion of the sealing resin 150 heated during the soldering. This configuration can ensure the soldering of the contact pins 141 to the circuit board 180.

Figure 4:
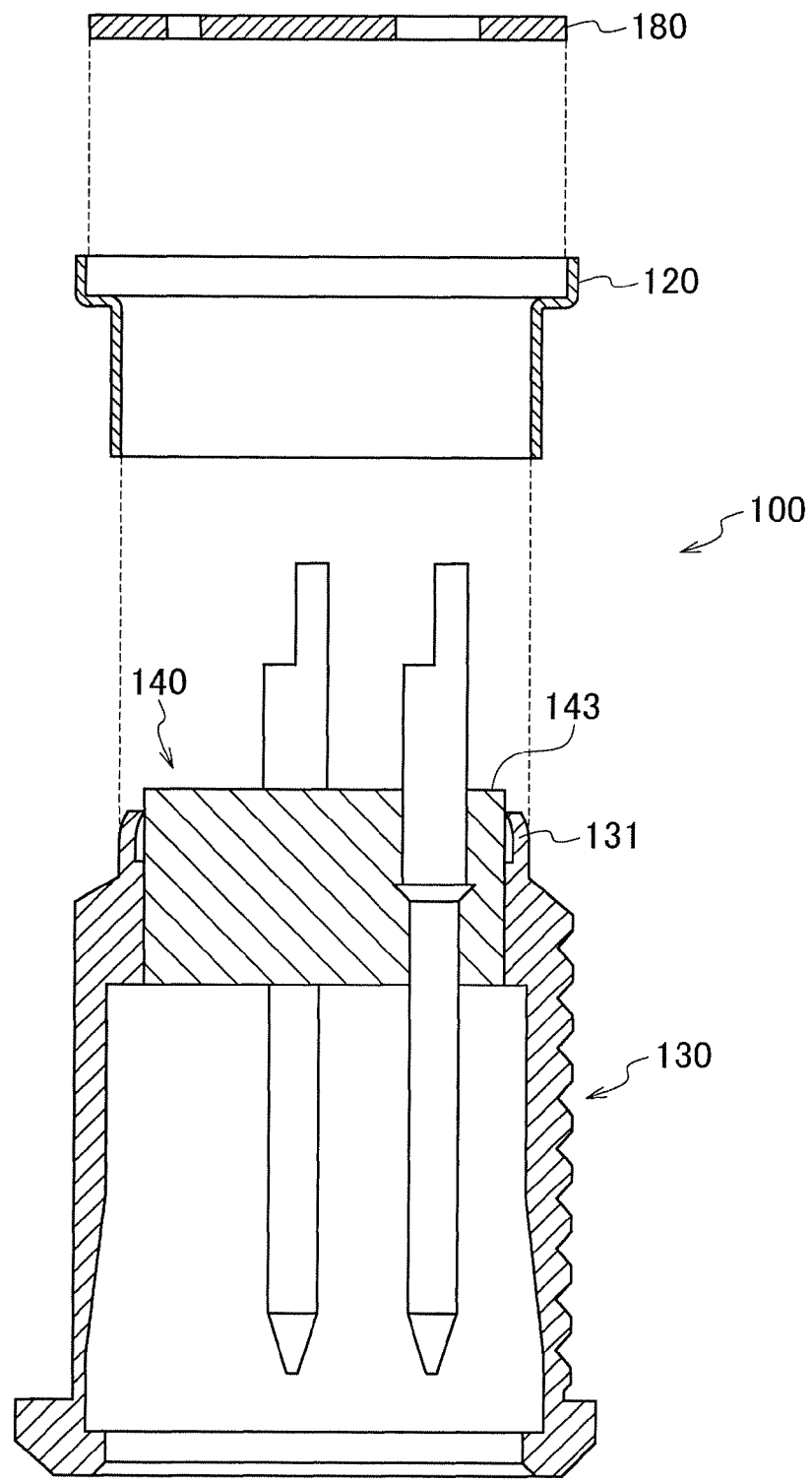
FIG. 4 illustrates an example step of fabrication of the connector illustrated in FIG. 1.

A process of fabricating the connector 100 will now be explained with reference to FIGS. 4 to 7. With reference to FIG. 4, the pin assembly 140 is fixed into the opening of the receptacle 130. In specific, after the insertion of the pin assembly 140 into the opening of the receptacle 130, the ridge 131 is bent inward of the receptacle 130, for example. The ridge 131 is thus brought into pressure contact with the outer periphery of the insulating base 143 to fix the pin assembly 140 to the receptacle 130.

Figure 5:
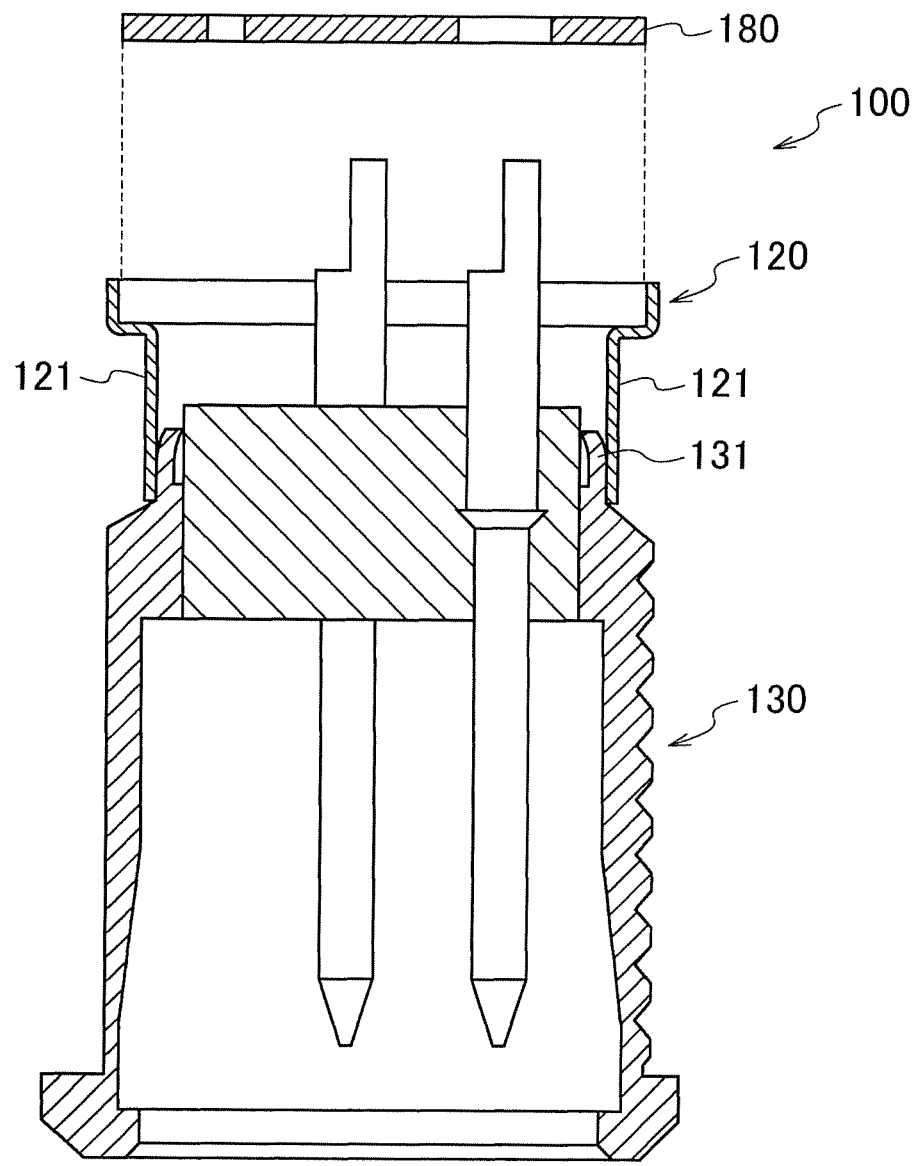
FIG. 5 illustrates another example step of fabrication of the connector illustrated in FIG. 1.

With reference to FIG. 5, the metal cylinder 120 is then fitted around the ridge 131 of the receptacle 130. The metal cylinder 120 is then soldered to the outer periphery of the receptacle 130 at the contact portions therebetween. This soldering fixes and electrically connects the metal cylinder 120 to the receptacle 130.

Figure 6:
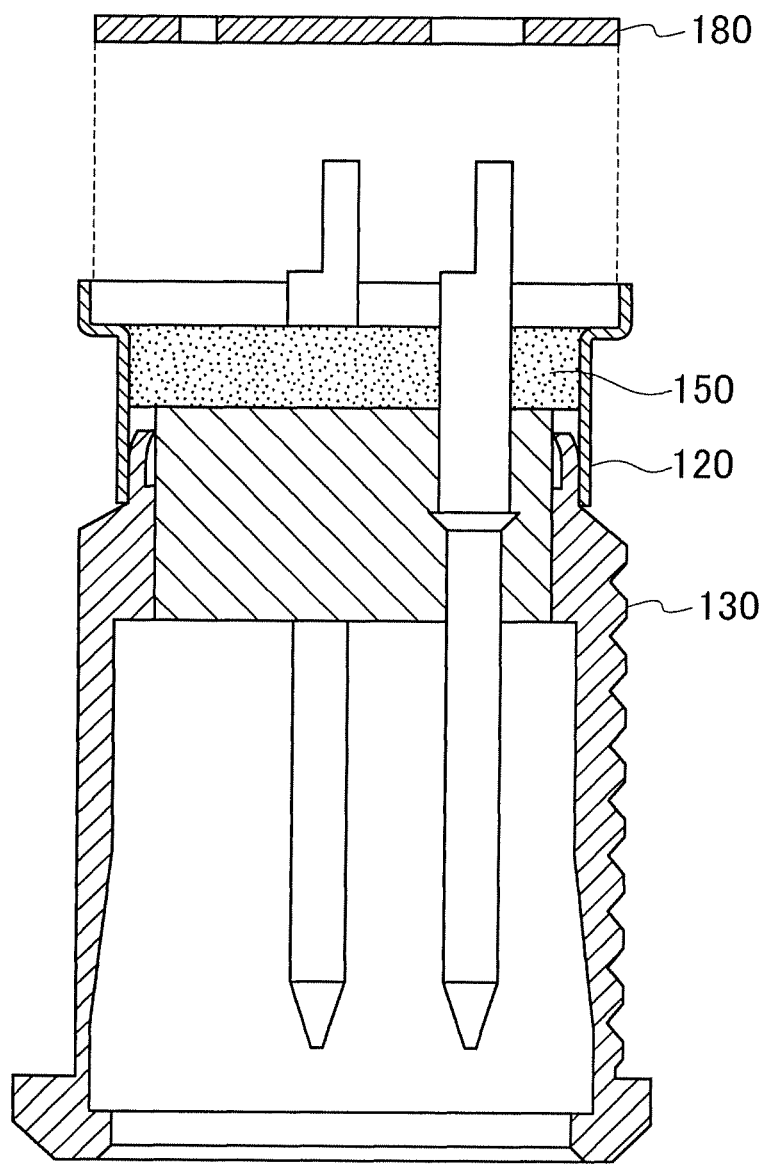
FIG. 6 illustrates another example step of fabrication of the connector illustrated in FIG. 1.

With reference to FIG. 6, the space defined by the metal cylinder 120 and the pin assembly 140 is then filled with the sealing resin 150. The volume of the sealing resin 150 should be adjusted such that the rear face of the circuit board 180, which will be disposed later, remains resting on the circuit-board receiver 122.

Figure 7:
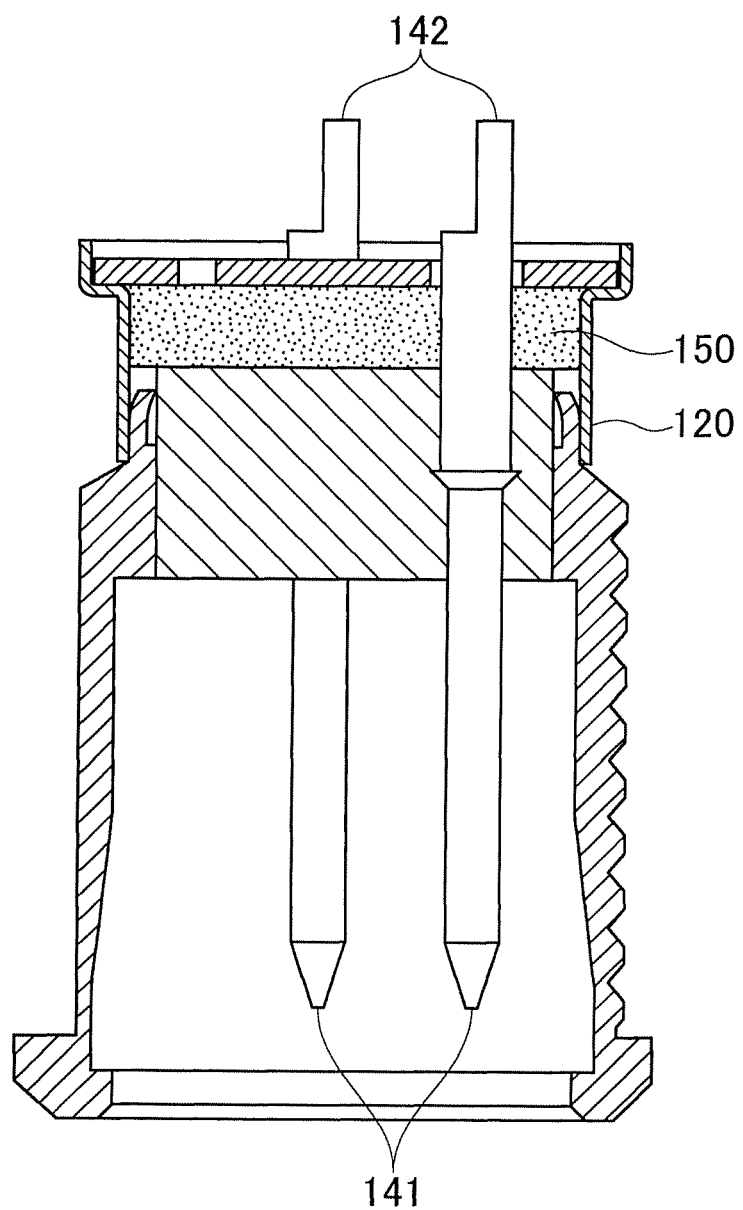
FIG. 7 illustrates another example step of fabrication of the connector illustrated in FIG. 1.

With reference to FIG. 7, the circuit board 180 is then mounted onto the circuit-board receiver 122 of the metal cylinder 120 such that the connecting terminals 142 extend through the respective through holes of the circuit board 180. The contact pins 141 are soldered to the respective wiring patterns 185 on the circuit board 180. During the soldering, the molten solder 170 (refer to FIG. 1) flows into the through holes of the circuit board 180, and is blocked by the sealing resin 150 at the ends of the through holes on the rear face of the circuit board 180.

As explained above, this process can fabricate the connector 100 more safely at high yield without short circuit between metal portions caused by the soldering. Alternatively, the sealing resin 150 may be fed through the opening 184 of the circuit board 180 after the mounting of the circuit board 180 onto the circuit-board receiver 122. In this case, the circuit board 180 should preferably have two or more openings 184. In the two or more openings 184, while the sealing resin 150 is being charged through one opening 184, the air in the space behind the circuit board 180 escapes through the other opening(s) 184. The sealing resin 150 can thus evenly spread in the space behind the circuit board 180.

Figure 8:
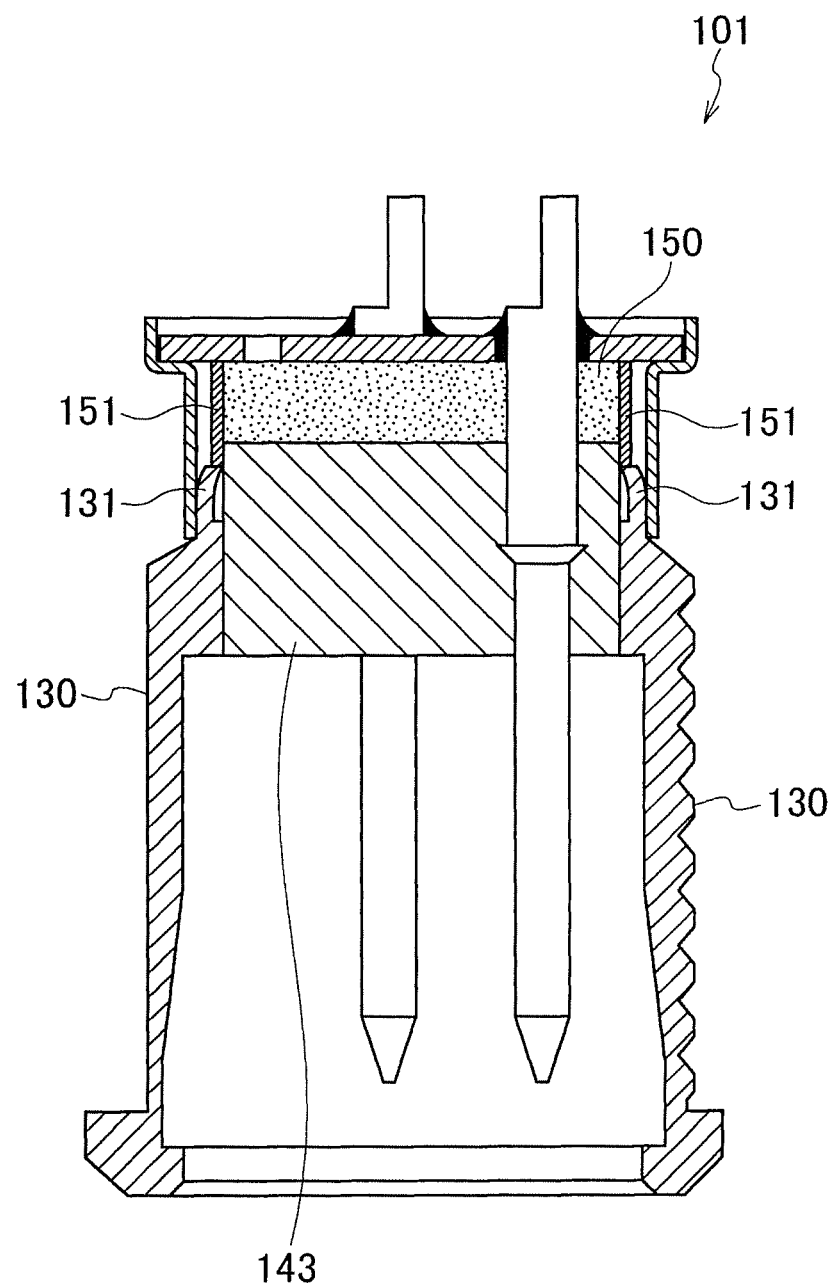
FIG. 8 is a longitudinal sectional view of a connector according to another embodiment of the invention.

A connector according to another embodiment of the invention will now be described. FIG. 8 is a longitudinal sectional view of an example connector 101 according to the embodiment. With reference to FIG. 8, the connector 101 includes an inner tube 151 in the space to be filled with the sealing resin 150.

The inner tube 151 is composed of a resin. The inner tube 151 is disposed on the top of the ridge 131 and surrounds the outer periphery of the upper end of the insulating base 143. The inner tube 151 can prevent the sealing resin 150 fed in the space behind the circuit board 180 from leaking through the joint between the upper edge of the receptacle 130 and the pin assembly 140. The inner tube 151 can also reduce the volume of the sealing resin 150 to be fed. Even a small volume of the sealing resin 150 can thus certainly infill the space behind the circuit board 180.

Figure 9:
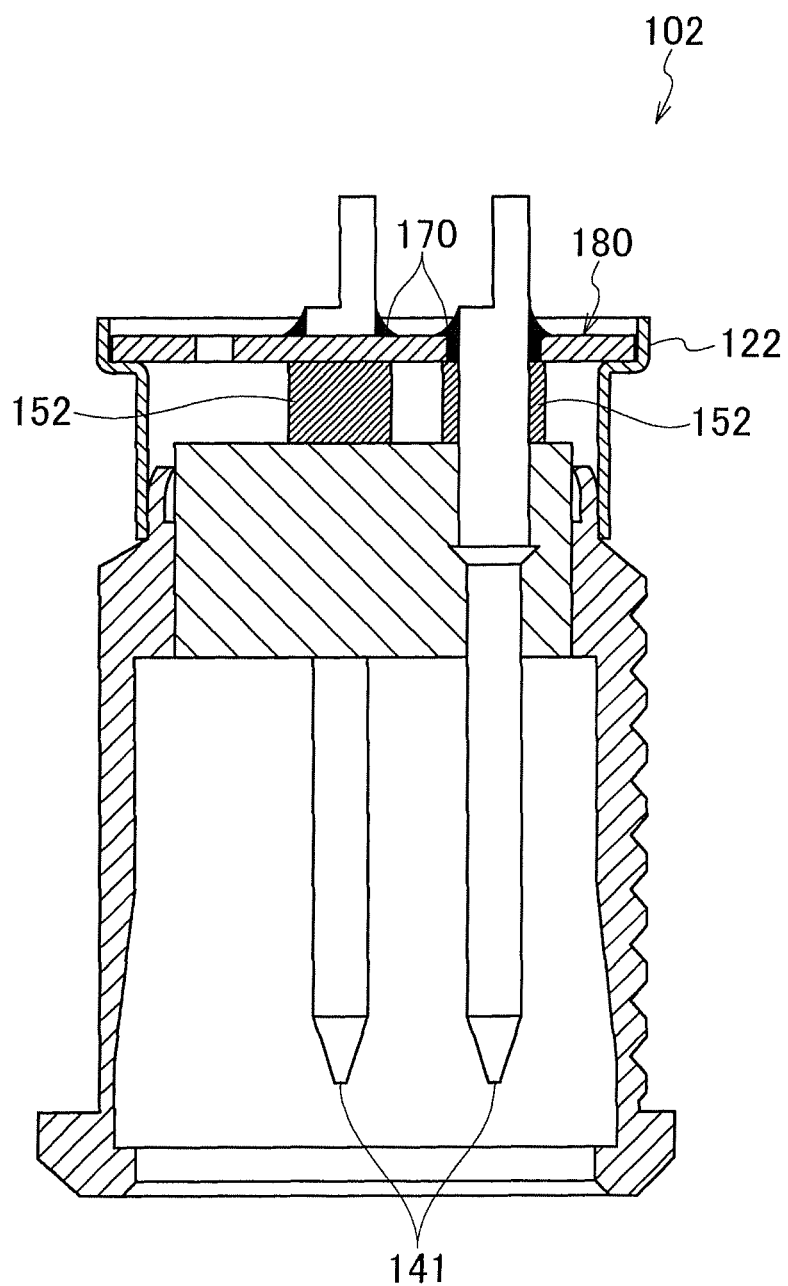
FIG. 9 is a longitudinal sectional view of a connector according to another embodiment of the invention.

A connector according to another embodiment of the invention will now be described. FIG. 9 is a longitudinal sectional view of an example connector 102 according to the embodiment. With reference to FIG. 9, the connector 102 includes flexible tubes 152 as sealants, in place of the sealing resin 150.

The flexible tubes 152 are each composed of a material, such as a heat-resistant resin, having flexibility and low wettability with the solder 170. The flexible tubes 152 are provided around the parts of the contact pins 141 extending inward from the insulating base 143. The length of each flexible tube 152 in the height direction is adjusted such that the circuit board 180 remains resting on the circuit-board receiver 122. The dimensions of the flexible tube 152 are adjusted so as to tightly fit on the rear face of the circuit board 180.

The flexible tubes 152 behind the circuit board 180 can prevent the molten solder 170 from leaking through the through holes. The molten solder 170 thus does not excessively flow into the through holes of the circuit board 180, so that the contact pins 141 can be soldered to the through holes with an optimal volume of the solder 170. The flexible tubes 152 can thus prevent the electrical conduction or short circuit between originally insulated portions.

The flexible tubes 152 may be composed of a heat-resistant resin containing an insulating magnetic powder. The flexible tubes 152 containing a magnetic powder (e.g., a ferrite powder) and the contact pins 141 define a low-pass filter. This configuration can improve the RF noise immunity of the connector 102.

The above-described connector according to the invention may also be attached to an end of a cable. In such a case, the connector according to the invention substitutes for the cable connector 200 illustrated in FIG. 10.

The invention claimed is:

1. A connector comprising:
   a metal cylinder;
   a conductive receptacle having an end fitted in an end of the metal cylinder;
   a pin assembly fitted in the conductive receptacle;
   pins fixed to the pin assembly, the pins being connected to a cable;
   a circuit board fixed to the other end of the metal cylinder, the circuit board comprising through holes electrically connected to the pins; and
   a sealant disposed between the circuit board and the pin assembly, the sealant infilling gaps between the pins and the through holes of the circuit board.

2. The connector according to claim 1, wherein the sealant comprises flexible tubes receiving the pins.

3. The connector according to claim 1, wherein the sealant comprises an insulating magnetic powder.

4. The connector according to claim 1, wherein the circuit board further comprises at least one opening extending through the circuit board, in addition to the through holes.

5. The connector according to claim 1, wherein the sealant is a resin infilling a space defined by the circuit board, the metal cylinder, and the pin assembly.

6. The connector according to claim 2, further comprising an inner tube inside the metal cylinder, the inner tube surrounding the upper end of the pin assembly, wherein
   the resin infills a space inside the inner tube.

* * * * *

UNITED STATES PATENT AND TRADEMARK OFFICE
CERTIFICATE OF CORRECTION

Page 1 of 1

PATENT NO. : 9,277,664 B2
APPLICATION NO. : 14/628757
DATED : March 1, 2016
INVENTOR(S) : Satoshi Yoshino, Shiro Kishimoto and Hiroshi Akino It is certified that error appears in the above-identified patent and that said Letters Patent is hereby corrected as shown below:

In the claims

Claim 6 in column 10, lines 21-24 should read as follows:

6. The connector according to claim 5, further comprising an inner tube inside the metal cylinder, the inner tube surrounding the upper end of the pin assembly, wherein
   the resin infills a space inside the inner tube.

Signed and Sealed this
Seventh Day of June, 2016

Michelle K. Lee
*Director of the United States Patent and Trademark Office*